United States Patent
Kim et al.

(10) Patent No.: US 9,019,778 B2
(45) Date of Patent: Apr. 28, 2015

(54) SEMICONDUCTOR APPARATUS

(71) Applicant: SK Hynix Inc., Icheon-si Gyeonggi-do (KR)

(72) Inventors: Young Ju Kim, Icheon-si (KR); Sang Hoon Shin, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 356 days.

(21) Appl. No.: 13/723,653

(22) Filed: Dec. 21, 2012

(65) Prior Publication Data

US 2014/0043884 A1    Feb. 13, 2014

(30) Foreign Application Priority Data

Aug. 8, 2012 (KR) .................. 10-2012-0086683

(51) Int. Cl.
| | | |
|---|---|---|
| *G11C 7/10* | (2006.01) | |
| *G11C 5/06* | (2006.01) | |
| *G11C 29/12* | (2006.01) | |
| *G11C 29/48* | (2006.01) | |

(52) U.S. Cl.
CPC .............. *G11C 5/06* (2013.01); *G11C 29/1201* (2013.01); *G11C 29/48* (2013.01)

(58) Field of Classification Search
CPC ........ G11C 29/48; G11C 29/022; G11C 7/10; G11C 2029/2602

USPC ................ 365/189.03, 63, 201, 198
See application file for complete search history.

(56) References Cited

U.S. PATENT DOCUMENTS

| | | | |
|---|---|---|---|
| 5,604,710 A * | 2/1997 | Tomishima et al. ..... | 365/230.03 |
| 5,808,960 A * | 9/1998 | McClure .................. | 365/233.16 |
| 5,930,187 A * | 7/1999 | Sato et al. ..................... | 365/201 |
| 6,166,989 A * | 12/2000 | Hamamoto et al. ........... | 365/51 |
| 6,216,240 B1 * | 4/2001 | Won et al. ................ | 365/189.02 |
| 2003/0043664 A1 * | 3/2003 | Haraguchi et al. ............ | 365/201 |
| 2004/0013016 A1 * | 1/2004 | Yamazaki et al. ............ | 365/201 |
| 2007/0242553 A1 * | 10/2007 | Do ........................... | 365/230.05 |
| 2009/0097345 A1 * | 4/2009 | Kushnarenko ................ | 365/201 |
| 2011/0292745 A1 * | 12/2011 | Ku ........................... | 365/189.16 |

FOREIGN PATENT DOCUMENTS

KR    101212777 B1    12/2012

* cited by examiner

*Primary Examiner* — Tuan T Nguyen
(74) *Attorney, Agent, or Firm* — William Park & Associates Patent Ltd.

(57) ABSTRACT

A semiconductor apparatus includes a memory chip which includes: a memory area; a data input/output block configured to communicate with the memory area; and a data transmission/reception block configured to connect one of a plurality of channels and a pad to the data input/output block, wherein the plurality of channels are configured to input and output normal data to and from another chip, and the pad is configured to input and output test data.

13 Claims, 3 Drawing Sheets

SEMICONDUCTOR APPARATUS

CROSS-REFERENCES TO RELATED APPLICATION

The present application claims priority under 35 U.S.C. §119(a) to Korean application number 10-2012-0086683, filed on Aug. 8, 2012, in the Korean Intellectual Property Office, which is incorporated herein by reference in its entirety.

BACKGROUND

1. Technical Field

The present invention generally relates to a semiconductor apparatus, and more particularly, to a three-dimensional (3D) semiconductor apparatus including a plurality of chips stacked therein.

2. Related Art

In order to increase the integration degree of a semiconductor apparatus, a 3D semiconductor apparatus including a plurality of chips stacked and packaged therein has been developed. The 3D semiconductor apparatus including two or more chips stacked in a vertical direction may exhibit a maximum integration degree in the same space.

In order to implement the 3D semiconductor apparatus, various methods may be applied. In one of the methods, a plurality of chips having the same structure are stacked and connected through wires such as metal lines so as to operate as one semiconductor.

Recently, a through-silicon via (TSV) method has been used, in which a plurality of stacked chips are electrically connected through TSVs. In a semiconductor apparatus using TSVs, a plurality of chips are connected vertically through the TSVs. Therefore, the semiconductor apparatus may reduce the package area more than a semiconductor apparatus including a plurality of chips connected through edge interconnections using wires.

FIG. 1 schematically illustrates a memory chip 10 forming a conventional semiconductor apparatus. In FIG. 1, the memory chip 10 includes a memory area 11, a data input/output block 12, a data transmission/reception unit 13, a plurality of channels DQ0, DQ1, DQ2, . . . , DQn−2, and DQn−1, a test pad 14, and a test data transmission/reception unit 15. The memory area 11 includes a plurality of memory cells. The data input/output block 12 is configured to perform a data input/output operation for the memory area 11 through a data input/output line GIO. The data input/output block 12 is connected to the data transmission/reception unit 13 and the test pad 14. The data input/output block 12 is connected to the data transmission/reception unit 13 and configured to receive data inputted through the plurality of channels DQ0, DQ1, DQ2, . . . , DQn−2, and DQn−1 or output data outputted from the data input/output block 12 to the plurality of channels DQ0, DQ1, DQ2, . . . , DQn−2, and DQn−1, during a normal operation. Furthermore, the data input/output block 12 is configured to receive data TDQ<0:m> from the test pad 14 and the test data transmission/reception unit 15 or output data to the test data transmission/reception unit 15 and the test pad 14, during a test operation. During the test operation, the conventional semiconductor apparatus does not use the data transmission/reception unit 13, but uses the test data transmission/reception unit 15 to perform the test operation. Therefore, the conventional semiconductor apparatus could not verify whether or not a defect occurs in the data transmission/reception unit 13.

SUMMARY

A semiconductor apparatus capable of performing a test for all circuits forming a memory chip regardless of operations modes of the semiconductor apparatus is described herein.

In an embodiment, a semiconductor apparatus includes a memory chip which includes: a memory area; a data input/output block configured to communicate with the memory area; and a data transmission/reception block configured to connect one of a plurality of channels and a pad to the data input/output block, wherein the plurality of channels are configured to input and output normal data to and from another chip, and the pad is configured to input and output test data.

In an embodiment, a semiconductor apparatus includes a memory chip which includes: a pad configured to input and output test data; a plurality of channels configured to input and output normal data when the memory chip is stacked with another chip, and be floated when the memory chip is not stacked with another chip; a data transmission and reception block configured to receive the test data from the pad during a test operation, and receive the normal data through the plurality of channels during a normal operation; and a data input/output block configured to receive data transmitted from the data transmission/reception block and communicate with a memory area.

In an embodiment, a semiconductor apparatus includes a memory chip which includes: a data input/output block configured to communicate with a memory area; a data transmission/reception unit configured to communicate with the data input/output block through one end thereof; and a path selection unit configured to selectively couple the other end of the data transmission/reception unit with one of a pad and a plurality of channels in response to a control signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the various embodiments will be described below with reference to the accompanying drawings through the embodiments.

Figure 1:
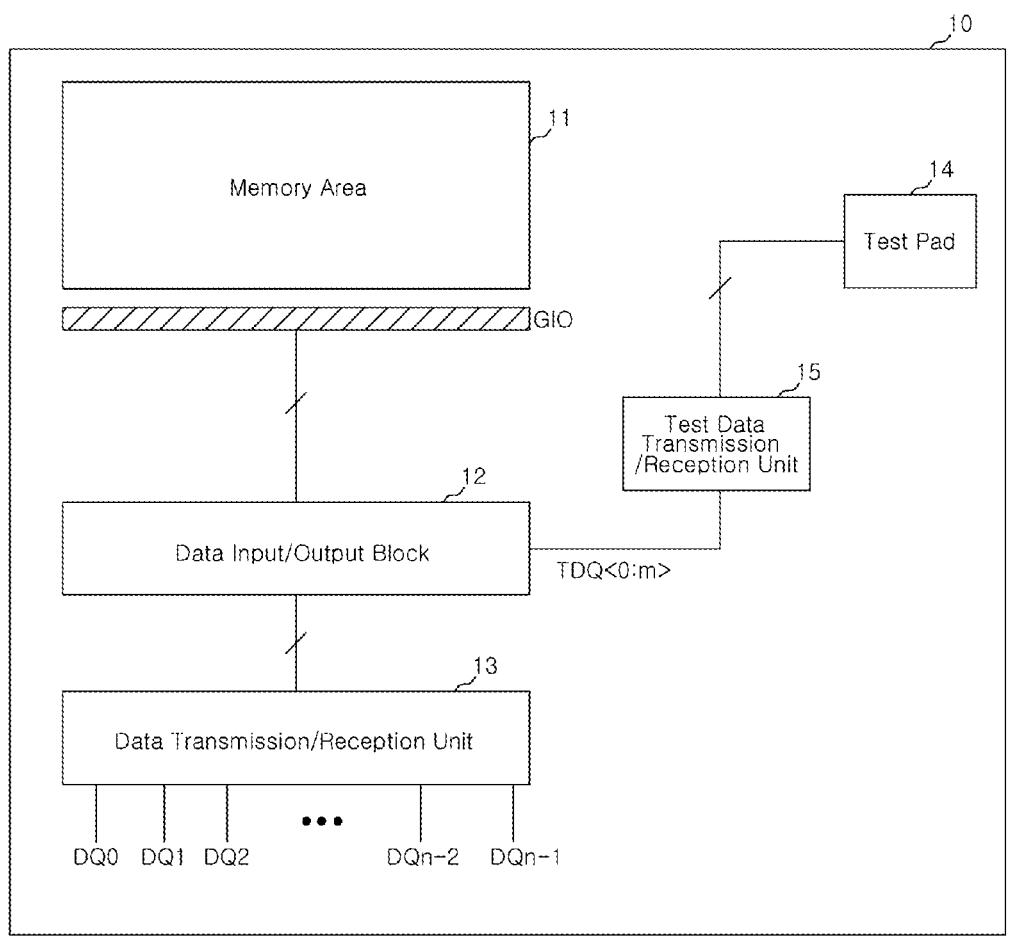
FIG. 1 schematically illustrates a memory chip forming a conventional semiconductor apparatus.
Figure 2:
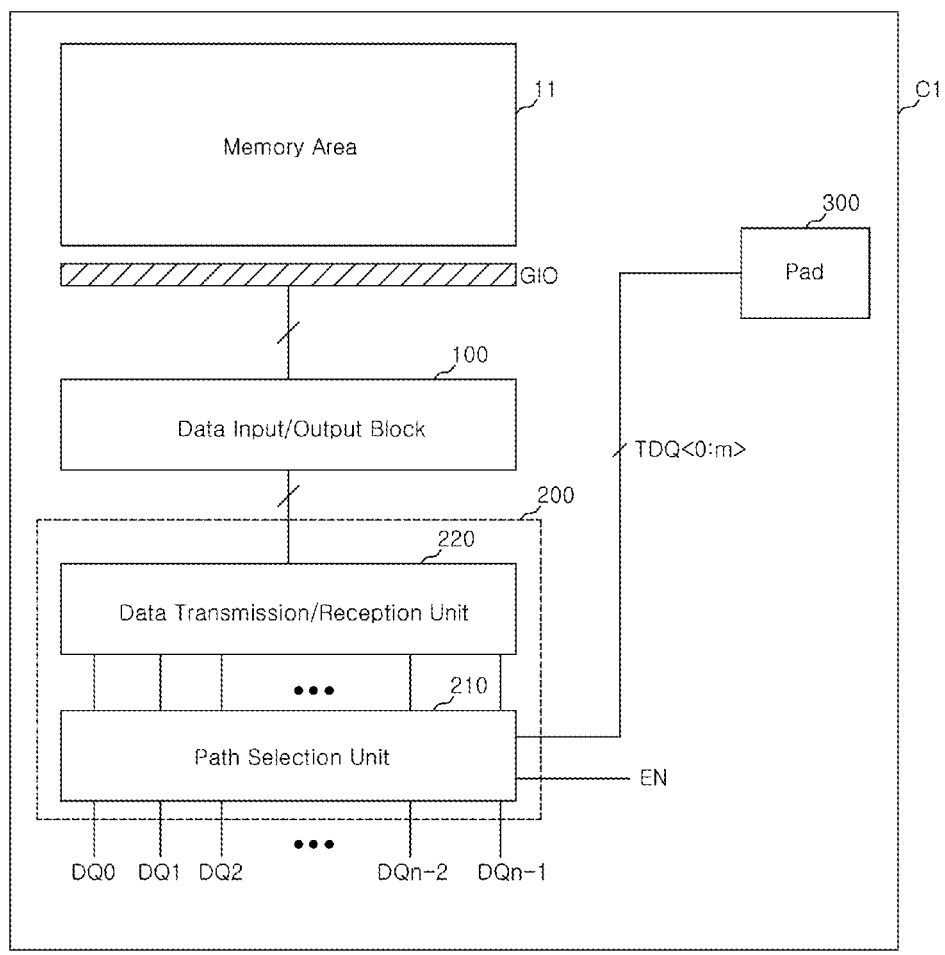
FIG. 2 illustrates the configuration of a semiconductor apparatus according to an embodiment.

FIG. 2 illustrates the configuration of a semiconductor apparatus 1 according to an embodiment. Referring to FIG. 2, the semiconductor apparatus 1 may include a memory chip C1. The memory chip C1 may be fabricated and tested on a wafer. Furthermore, the memory chip C1 may be diced and then stacked with another chip so as to construct a stacked semiconductor apparatus.

The memory chip C1 may include a memory area 11, a data input/output block 100, a data transmission/reception block 200, a plurality of channels DQ0, DQ1, DQ2, . . . , DQn−2, and DQn−1, and a pad 300. The memory area 11 may include a plurality of memory cell arrays to store data. The memory area 11 may include a plurality of banks and a plurality of mats, for example. Each of the banks and the mats corresponds to a group of memory cell arrays.

The data input/output block 100 may be coupled with the memory area 11, and configured to communicate with the memory area 11. For example, the data input/output block 100 may transmit data to the memory area 11 such that the data may be stored in the memory area 11, during a write operation. Furthermore, the data input/output block 100 may receive data stored in the memory area 11 and output the received data, during a read operation. Therefore, the data input/output block 100 corresponds to a circuit to perform a data input/output operation of the memory area 11, and may include input/output circuits such as a write driver and a read sense amplifier which are not illustrated.

The data input/output block 100 may communicate with the memory area 11 through a data input/output line GIO. The data input/output line GIO may include a plurality of data lines GIO corresponding to the IO number of the memory chip C1, and the data input/output line GIO and the data input/output block 100 may input and output a plurality of parallel data.

The data transmission/reception block 200 may be coupled with the plurality of channels DQ0, DQ1, DQ2, ..., DQn−2, and DQn−1, the pad 300, and the data input/output block 100. The data transmission/reception block 200 couples one of the channels DQ0, DQ1, DQ2, ..., DQn−2, and DQn−1 and the pad 300 to the data input/output block 100. The data transmission/reception block 200 couples one of the channels DQ0, DQ1, DQ2, ..., DQn−2, and DQn−1 and the pad 300 to the data input/output block 100 depending on operation modes. For example, the data transmission/reception block 200 couples the plurality of channels DQ0, DQ1, DQ2, ..., DQn−2, and DQn−1 to the data input/output block 100 during a normal operation, and couples the pad 300 to the data input/output block 100 during a test operation. In order to distinguish the operation modes, the data transmission/reception block 200 may selectively couple one of the channels DQ0, DQ1, DQ2, ..., DQn−2, and DQn−1 and the pad 300 to the data input/output block 100 in response to a control signal EN.

In FIG. 2, the data transmission/reception block 200 may include a path selection unit 210 and a data transmission/reception unit 220. The path selection unit 210 is configured to select one of the channels DQ0, DQ1, DQ2, ..., DQn−2, and DQn−1 and the pad 300 as a data path in response to the control signal EN. The data transmission/reception unit 220 may be coupled with the path selection unit 210. The data transmission/reception 220 transmits data inputted through the path selection unit 210 to the data input/output block 100, or outputs data inputted through the data input/output block 100 to the path selection unit 210.

The control signal EN may include any signals for distinguishing the test operation and the normal operation. For example, a test mode signal may be used. However, the control signal EN is not limited thereto, but a stack enable signal generated when the memory chip C1 is stacked may be used.

During the normal operation, when the path selection unit 210 selects the plurality of channels DQ0, DQ1, DQ2, ..., DQn−2, and DQn−1 as a data path, the data transmission/reception unit 220 may receive data inputted through the channels DQ0, DQ1, DQ2, ..., DQn−2, and DQn−1 and transmit the received data to the data input/output block 100. Furthermore, the data transmission/reception unit 220 may receive data stored in the memory area 11 from the data input/output block 100 and output the received data to the plurality of channels DQ0, DQ1, DQ2, ..., DQn−2, and DQn−1. During the test operation, when the path selection unit 210 selects the pad 300 as a data path, the data transmission/reception unit 220 may receive data inputted through the pad 300 and transmit the received data to the data input/output block 100. Furthermore, the data transmission/reception unit 220 may receive data stored in the memory area 11 from the data input/output block 100 and output the received data to the pad 300.

The plurality of channels DQ0, DQ1, DQ2, ..., DQn−2, and DQn−1 serve as data paths to transmit normal data. When the memory chip C1 is stacked with another chip, the plurality of channels DQ0, DQ1, DQ2, ..., DQn−2, and DQn−1 are coupled with the chip so as to receive normal data from the chip or transmit normal data to the chip. One ends of the channels DQ0, DQ1, DQ2, ..., DQn−2, and DQn−1 are coupled with the data transmission/reception block 200. When the memory chip C1 is on a wafer, the other ends of the channels DQ0, DQ1, DQ2, ..., DQn−2, and DQn−1 are floated. Therefore, when a test operation for the memory chip C1 is performed on a wafer, the channels DQ0, DQ1, DQ2, ..., DQn−2, and DQn−1 are not utilized as data paths. When the memory chip C1 is diced and then stacked with another chip, the other ends of the channels DQ0, DQ1, DQ2, ..., DQn−2, and DQn−1 may form an electrical connection with the chip through connection elements such as through vias. When the memory chip C1 is stacked and a normal operation is performed, the channels DQ0, DQ1, DQ2, ..., DQn−2, and DQn−1 are utilized as data paths for transmitting normal data.

Since the pad 300 is a data path to transmit test data TDQ<0:m>, the pad 300 may include a test pad. The pad 300 may be coupled with the data transmission/reception block 200, and input and output the test data TDQ<0:m> to and from a controller, a test device, or a self test circuit. The pad 300 is provided to perform a test on the memory chip C1 when the memory chip C1 is on a wafer.

The operation of the semiconductor apparatus 1 according to the embodiments will be described as follows. When the memory chip C1 is positioned on a wafer and a test operation is performed, the path selection unit 210 couples the pad 300 and the data transmission/reception unit 220 in response to the control signal EN. Therefore, the test data TDQ<0:m> may be inputted to the data input/output block 100 through the pad 300 and the data transmission/reception unit 220. The data input/output block 100 performs a data input/output operation for the memory area 11, and data outputted through the data input/output block 100 may be outputted through the data transmission/reception unit 220 and the pad 300.

When the memory chip C1 is stacked with another chip and a normal operation is performed, the path selection unit 210 couples the channels DQ0, DQ1, DQ2, ..., DQn−2, and DQn−1 and the data transmission/reception unit 220 in response to the control signal EN. Therefore, normal data may be inputted to the data input/output block 100 through the channels DQ0, DQ1, DQ2, ..., DQn−2, and DQn−1 and the data transmission/reception unit 220. The data input/output block 100 performs a data input/output operation for the memory area 11, and data outputted through the data input/output block 100 may be outputted through the data transmission/reception unit 220 and the channels DQ0, DQ1, DQ2, ..., DQn−2, and DQn−1.

In both of the test operation and the normal operation, the test data TDQ<0:m> and normal data may be inputted or outputted through the data transmission/reception unit 220, the data input/output block 100, and the memory area 11. That is, the test data TDQ<0:m> and the normal data pass through all circuit paths. Therefore, during the test operation for the memory chip C1, the test is performed through all circuits provided in the memory chip C1. Therefore, it is possible to verify whether or not each of the circuits has a defect.

Figure 3:
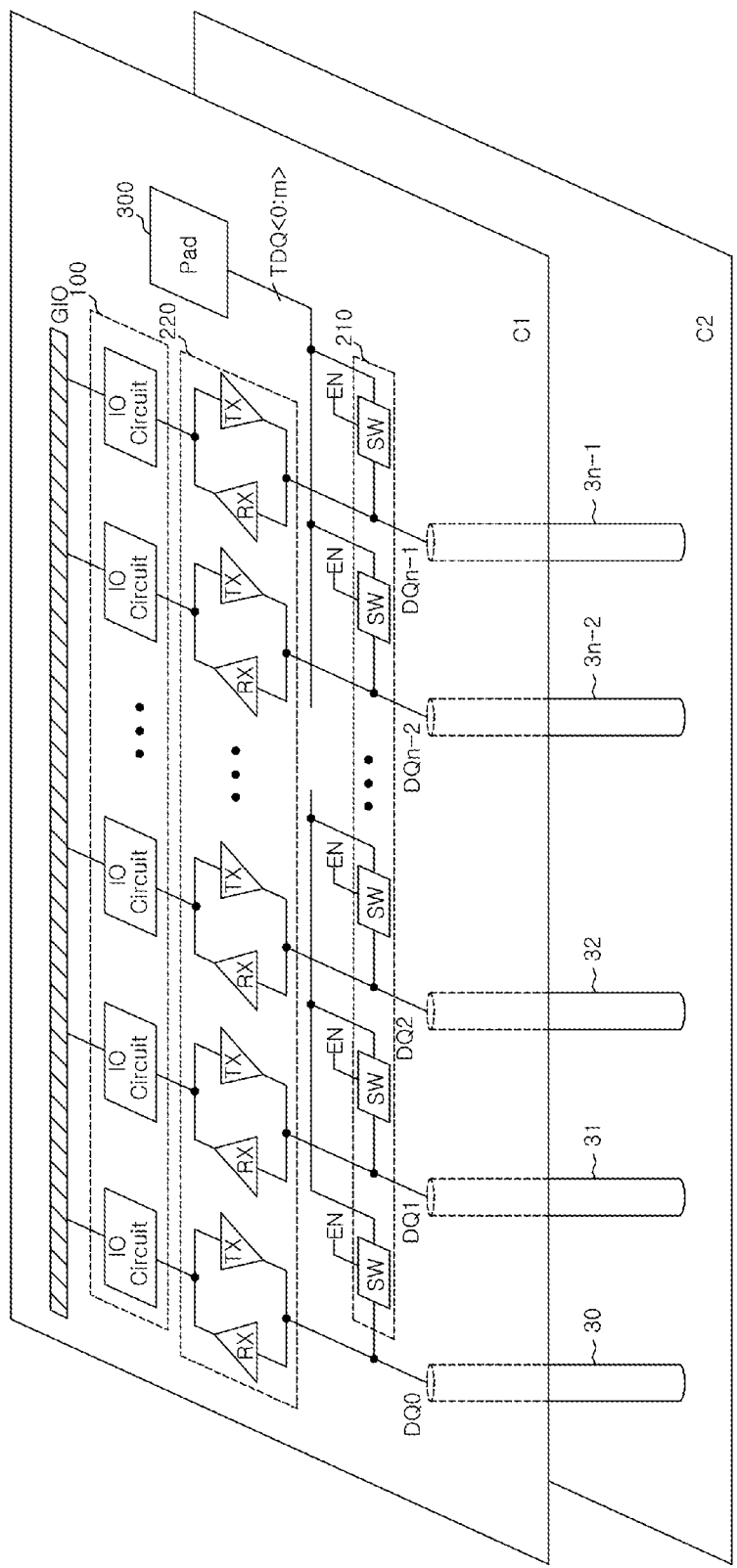
FIG. 3 illustrates the detailed configuration of the semiconductor apparatus of FIG. 2.

FIG. 3 illustrates the detailed configuration of the semiconductor apparatus 1 of FIG. 2. Referring to FIG. 3, the data input/output block 100 may include a plurality of input/output circuits (IO circuits). Each of the input/output circuits may include a write driver and a read sense amplifier to perform write and read operations of the memory chip C1, as described above. For example, the data input/output block 100 may include a plurality of input/output circuits corresponding to the number of the data input/output lines GIO.

The data transmission/reception unit 220 may include a plurality of receivers RX and transmitters TX. The data transmission/reception unit 220 may include a plurality of receivers RX and transmitters TX corresponding to the number of the input/output circuits. One ends of the receivers RX and the transmitters TX forming the data transmission/reception unit 220 are coupled with the input/output circuits. The other ends of the receivers RX and the transmitters TX are coupled with the path selection unit 210. The receivers RX buffer data inputted through the pad 300 and the channels DQ0, DQ1, DQ2, . . . , DQn−2, and DQn−1 and output the buffered data to the input/output circuits, and the transmitters TX buffer data inputted from the input/output circuits and output the buffered data to the pad 300 and the channels DQ0, DQ1, DQ2, . . . , DQn−2, and DQn−1.

The path selection unit 210 couples one of the pad 300 and the channels DQ0, DQ1, DQ2, . . . , DQn−2, and DQn−1 to the data transmission/reception unit 220 in response to the control signal EN. Specifically, the path selection unit 210 may include a plurality of switches SW responding to the control signal EN. The switches SW are coupled with the other ends of the receivers RX and the transmitters TX forming the data transmission/reception unit 220, respectively. Each of the switches SW couples the pad 300 to the data transmission/reception unit 220 when turned on in response to the control signal EN, and cuts off the connection between the pad 300 and the data transmission/reception unit 220 when turned off in response to the control signal EN. That is, when the switches SW are turned off, the channels DQ0, DQ1, DQ2, . . . , DQn−2, and DQn−1 may be coupled with the data transmission/reception unit 220.

When the memory chip C1 is stacked with another chip C2, the memory chip C1 may be electrically connected to the chip C2 through connection elements such as through vias 30, 31, 32, . . . , 3 n−2, and 3 n−1. Therefore, when the memory chip C1 is on a wafer, the floated other ends of the channels DQ0, DQ1, DQ2, . . . , DQn−2, and DQn−1 form electrical connections with channels of the chip C2. Therefore, normal data may be transmitted from the memory chip C1 to the chip C2 or from the chip C2 to the first memory chip C1 through the channels DQ0, DQ1, DQ2, . . . , DQn−2, and DQn−1 and the through vias 30, 31, 32, 3 n−2, and 3 n−1.

While various embodiments have been described above, it will be understood to those skilled in the art that the embodiments described are by way of example only. Accordingly, the semiconductor apparatus.

What is claimed is:

1. A semiconductor apparatus comprising a memory chip which comprises:
   a memory area;
   a data input/output block configured to communicate with the memory area; and
   a data transmission/reception block configured to connect one of a plurality of channels and a pad to the data input/output block,
   wherein the plurality of channels are configured to input and output normal data to and from another chip, and the pad is configured to input and output test data.

2. The semiconductor apparatus according to claim 1, wherein the data transmission/reception block comprises:
   a path selection unit configured to select one of the plurality of channels and the pad as a data path; and
   a data transmission/reception unit configured to output data inputted through the path selection unit to the data input/output block or output data inputted from the data input/output block to the path selection unit.

3. The semiconductor apparatus according to claim 2, wherein the path selection unit comprises a switch connected to one of the pad and the plurality of channels in response to a control signal.

4. The semiconductor apparatus according to claim 1, wherein the memory area comprises a plurality of mats and banks.

5. A semiconductor apparatus comprising a memory chip which comprises:
   a pad configured to input and output test data;
   a plurality of channels configured to input and output normal data when the memory chip is stacked with another chip, and be floated when the memory chip is not stacked with another chip;
   a data transmission and reception block configured to receive the test data from the pad during a test operation, and receive the normal data through the plurality of channels during a normal operation; and
   a data input/output block configured to receive data transmitted from the data transmission/reception block and communicate with a memory area.

6. The semiconductor apparatus according to claim 5, wherein the data transmission/reception block comprises:
   a path selection unit configured to select the pad as a data path during the test operation, and select the plurality of channels as the data path during the normal operation; and
   a data transmission/reception unit configured to output data inputted through the path selection unit to the data input/output block.

7. The semiconductor apparatus according to claim 6, wherein the path selection unit comprises a switch connected to one of the pad and the plurality of channels in response to a control signal.

8. A semiconductor apparatus comprising a memory chip which comprises:
   a data input/output block configured to communicate with a memory area;
   a data transmission/reception unit configured to communicate with the data input/output block through one end thereof; and
   a path selection unit configured to selectively couple the other end of the data transmission/reception unit with one of a pad and a plurality of channels in response to a control signal.

9. The semiconductor apparatus according to claim 8, wherein the pad inputs and outputs test data during a test operation.

10. The semiconductor apparatus according to claim 8, wherein the plurality of channels receive data from another chip or transmit data of the memory chip to another chip, during a normal operation.

11. The semiconductor apparatus according to claim 10, wherein the memory chip is stacked with the another chip and is electrically connected to the another chip through vias.

12. The semiconductor apparatus according to claim 8, wherein the data input/output block comprises a write driver and a read sense amplifier.

13. The semiconductor apparatus according to claim 8, wherein the data transmission/reception unit comprises a receiver and a transmitter.

\* \* \* \* \*